United States Patent
Radkov et al.

(10) Patent No.: US 7,497,973 B2
(45) Date of Patent: *Mar. 3, 2009

(54) RED LINE EMITTING PHOSPHOR MATERIALS FOR USE IN LED APPLICATIONS

(75) Inventors: Emil Vergilov Radkov, Euclid, OH (US); Ljudmil Slavchev Grigorov, Sofia (BG); Anant Achyut Setlur, Niskayuna, NY (US); Alok Mani Srivastava, Niskayuna, NY (US)

(73) Assignee: Lumination LLC, Valley View, OH (US)

( * ) Notice: Subject to any disclaimer, the term of this patent is extended or adjusted under 35 U.S.C. 154(b) by 239 days.

This patent is subject to a terminal disclaimer.

(21) Appl. No.: 11/364,611

(22) Filed: Feb. 28, 2006

(65) Prior Publication Data

US 2006/0169998 A1    Aug. 3, 2006

Related U.S. Application Data

(63) Continuation-in-part of application No. 11/049,598, filed on Feb. 2, 2005, and a continuation-in-part of application No. 11/285,442, filed on Nov. 22, 2005.

(51) Int. Cl.
*C09K 11/61* (2006.01)
*H01L 33/00* (2006.01)

(52) U.S. Cl. ............... 252/301.4 H; 252/301.4 F; 257/98; 313/503

(58) Field of Classification Search ........ 252/301.4 H, 252/301.4 F, 301.6 F; 257/98; 313/503
See application file for complete search history.

(56) References Cited

U.S. PATENT DOCUMENTS

| 3,450,642 A | 6/1969 | Hoffman |
| 3,569,764 A | 3/1971 | Hanada et al. |
| 3,617,357 A | 11/1971 | Nagy |
| 4,075,532 A | 2/1978 | Piper et al. |
| 4,079,287 A | 3/1978 | Soules et al. |
| 4,267,485 A | 5/1981 | Murakami et al. |

(Continued)

FOREIGN PATENT DOCUMENTS

EP    0 993 022 A1    4/2000

(Continued)

OTHER PUBLICATIONS

Paulusz, "Effective Mn(IV) Emission in Fluoride Coordination", J. electrochemical Soc., 120 N7, 1973, pp. 942-947.*

(Continued)

*Primary Examiner*—C. Melissa Koslow
(74) *Attorney, Agent, or Firm*—Fay Sharpe LLP

(57) ABSTRACT

Light emitting devices including a light source and a phosphor material including a complex fluoride phosphor activated with $Mn^{4+}$ which may comprise at least one of (1) $A_2[MF_6]:Mn^{4+}$, where A is selected from Li, Na, K, Rb, Cs, $NH_4$, and combinations thereof; and where M is selected from Ge, Si, Sn, Ti, Zr, and combinations thereof; (2) $E[MF_6]:Mn^{4+}$, where E is selected from Mg, Ca, Sr, Ba, Zn, and combinations thereof; and where M is selected from Ge, Si, Sn, Ti, Zr, and combinations thereof; (3) $Ba_{0.65}Zr_{0.35}F_{2.70}:Mn^{4+}$; or (4) $A_3[ZrF_7]:Mn^{4+}$ where A is selected from Li, Na, K, Rb, Cs, $NH_4$, and combinations thereof.

23 Claims, 7 Drawing Sheets

U.S. PATENT DOCUMENTS

| | | | |
|---|---|---|---|
| 4,705,986 A | 11/1987 | Iwama et al. | |
| 4,806,824 A | 2/1989 | Paynter et al. | |
| 4,874,984 A | 10/1989 | Sigai et al. | |
| 4,891,550 A | 1/1990 | Northrop et al. | |
| 4,924,141 A | 5/1990 | Taubner et al. | |
| 5,041,758 A | 8/1991 | Huiskes et al. | |
| 5,049,779 A | 9/1991 | Itsuki et al. | |
| 5,207,948 A | 5/1993 | Wolfe et al. | |
| 5,350,971 A | 9/1994 | Jeong | |
| 5,612,590 A | 3/1997 | Trushell et al. | |
| 5,714,836 A | 2/1998 | Hunt et al. | |
| 5,731,658 A | 3/1998 | Lengyel et al. | |
| 5,731,659 A | 3/1998 | Soules et al. | |
| 5,770,917 A | 6/1998 | Yano et al. | |
| 5,838,101 A | 11/1998 | Pappalardo | |
| 5,851,063 A | 12/1998 | Doughty et al. | |
| 5,859,496 A | 1/1999 | Murazaki et al. | |
| 5,869,927 A | 2/1999 | Matsuo et al. | |
| 5,959,316 A | 9/1999 | Lowery | |
| 5,962,971 A | 10/1999 | Chen | |
| 5,998,925 A | 12/1999 | Shimizu et al. | |
| 6,010,644 A | 1/2000 | Fu et al. | |
| 6,013,199 A | 1/2000 | McFarland et al. | |
| 6,066,861 A | 5/2000 | Höhn et al. | |
| 6,069,440 A | 5/2000 | Shimizu et al. | |
| 6,084,250 A | 7/2000 | Jüstel et al. | |
| 6,096,243 A | 8/2000 | Oshio et al. | |
| 6,116,754 A | 9/2000 | Ocsovai et al. | |
| 6,117,362 A | 9/2000 | Yen et al. | |
| 6,137,217 A | 10/2000 | Pappalardo et al. | |
| 6,153,971 A | 11/2000 | Shimizu et al. | |
| 6,165,385 A | 12/2000 | Rao et al. | |
| 6,203,726 B1 | 3/2001 | Danielson et al. | |
| 6,210,605 B1 | 4/2001 | Srivastava et al. | |
| 6,222,312 B1 | 4/2001 | Ghosh et al. | |
| 6,246,744 B1 | 6/2001 | Duclos et al. | |
| 6,249,328 B1 | 6/2001 | Fukuzawa et al. | |
| 6,252,254 B1 | 6/2001 | Soules et al. | |
| 6,255,670 B1 | 7/2001 | Srivastava et al. | |
| 6,278,135 B1 | 8/2001 | Srivastava et al. | |
| 6,294,800 B1 | 9/2001 | Duggal et al. | |
| 6,302,959 B2 | 10/2001 | Srivastava et al. | |
| 6,319,425 B1 | 11/2001 | Tasaki et al. | |
| 6,351,069 B1 | 2/2002 | Lowery et al. | |
| 6,366,033 B1 | 4/2002 | Greci et al. | |
| 6,369,502 B1 | 4/2002 | Auber et al. | |
| 6,380,669 B1 | 4/2002 | Zachau et al. | |
| 6,400,097 B1 | 6/2002 | Jin et al. | |
| 6,402,987 B1 | 6/2002 | Srivastava et al. | |
| 6,409,938 B1 | 6/2002 | Comanzo | |
| 6,429,583 B1 | 8/2002 | Levinson et al. | |
| 6,466,135 B1 | 10/2002 | Srivastava et al. | |
| 6,472,812 B2 | 10/2002 | Vose et al. | |
| 6,504,179 B1 | 1/2003 | Ellens et al. | |
| 6,513,949 B1 | 2/2003 | Marshall et al. | |
| 6,515,314 B1 | 2/2003 | Duggal et al. | |
| 6,517,741 B1 | 2/2003 | Feldmann et al. | |
| 6,521,915 B2 | 2/2003 | Odaki et al. | |
| 6,522,065 B1 | 2/2003 | Srivastava et al. | |
| 6,538,371 B1 | 3/2003 | Duggal et al. | |
| 6,552,487 B1 | 4/2003 | Ellens et al. | |
| 6,555,958 B1 | 4/2003 | Srivastava et al. | |
| 6,576,931 B2 | 6/2003 | Furukawa et al. | |
| 6,580,097 B1 | 6/2003 | Soules et al. | |
| 6,592,780 B2 | 7/2003 | Höhn et al. | |
| 6,596,195 B2 | 7/2003 | Srivastava et al. | |
| 6,621,211 B1 | 9/2003 | Srivastava et al. | |
| 6,660,186 B2 | 12/2003 | Ravilisetty | |
| 6,669,866 B1 | 12/2003 | Kummer et al. | |
| 7,094,362 B2 | 8/2006 | Setlur et al. | |
| 2002/0105266 A1 | 8/2002 | Mayr | |
| 2002/0158565 A1 | 10/2002 | Setlur et al. | |
| 2002/0195587 A1 | 12/2002 | Srivastava et al. | |
| 2003/0006694 A1 | 1/2003 | Carter | |
| 2003/0030060 A1 | 2/2003 | Okazaki | |
| 2003/0094893 A1 | 5/2003 | Ellens et al. | |
| 2005/0117361 A1 | 6/2005 | Takeda et al. | |
| 2005/0156496 A1 | 7/2005 | Takashima et al. | |
| 2005/0230689 A1 | 10/2005 | Setlur et al. | |
| 2005/0239227 A1 | 10/2005 | Aanegola et al. | |
| 2005/0253114 A1 | 11/2005 | Setlur | |
| 2006/0071589 A1* | 4/2006 | Radkov | 313/487 |
| 2007/0114562 A1* | 5/2007 | Radkov et al. | 257/103 |

FOREIGN PATENT DOCUMENTS

| | | |
|---|---|---|
| EP | 1 116 418 B1 | 7/2000 |
| EP | 1 095 998 A2 | 10/2000 |
| EP | 1 138 747 A2 | 10/2001 |
| EP | 1 139 440 A2 | 10/2001 |
| EP | 1 184 893 A2 | 3/2002 |
| EP | 1 193 306 A | 4/2002 |
| EP | 1 403 355 A | 3/2004 |
| JP | 2005 093912 A | 4/2005 |
| JP | 359404 | 12/2006 |
| WO | WO 00/33389 | 6/2000 |
| WO | WO 01/93342 A1 | 6/2001 |
| WO | WO 01/89000 A1 | 11/2001 |
| WO | WO 01/89001 A2 | 11/2001 |
| WO | WO 02/099902 A1 | 12/2002 |
| WO | WO 03/102113 A1 | 12/2003 |
| WO | WO 2004/056940 A1 | 7/2004 |
| WO | WO 2005/083037 A | 9/2005 |

OTHER PUBLICATIONS

International Search Report mailed Aug. 30, 2007, Authorized Officer Wengeler, Heinz.

G. Blasse and A. Bril, "On the $Eu^{3+}$ Fluorescence in Mixed Metal Oxides. III. Energy Transfer in $Eu^{3+}$ - Activated Tungstates and Molybdates of the Type $Ln_2WO_6$ and $Ln_2MoO_6$", *The Journal of Chemical Physics*, vol. 45, No. 7, Oct. 1966, pp. 2350-2355.

J.S. Kim et al.: "gaN-based white-light-emitting diodes fabricated with a mixture of Ba3Mgsi2O8:eu and Sr2SiO4: Eu phophors", *Japanese Journal of Applied Physics*, vol. 43, No. 3, 2004, pp. 989-992.

Narukawa, Yukio, "Present Status of UV-LDs and White LEDs", Patented Abstracts of the International Synoposium on The Light for the $2^{nd}$ Century, Mar. 2002, Tokyo, K-4, pp. 14-15.

Inorganic Phosphors: Compositions, Preparation and Optical Properties, CRC Press, 2004.

A.G. Paulusz,, "Efficient Mn(IV) Emission in Fluorine Coordination", J. Electrochem. Soc., 120, N7 (1973), p. 942.

"Spectra of Manganese(IV) Hexafluoride Ion ($MnF_6^=$) in Environments of O $h$ and D $3d$ Symmetry" by Lindsay Helmholz and M. E. Russo; *The Journal of Chemical Physics*, Nov. 15, 1973, p. 5455, vol. 59, No. 10.

"Vibronic Spectra and Lattice Dynamics of $Cs_2MnF_6$ and $A^1{}_2M^{IV}F_6$:$MnF^{2-}{}_6$" by S. L. Chodos; *The Journal of Chemical Physics*, Dec. 1, 1976, p. 4816, vol. 65, No. 11.

"Splitting of Vibronic Levels in $Cs_2SiF_6$ : $Mn^{4+}$"by Neil B. Manson and G. Ali Shah; *J. Phys. C: Solid State Phys.*, 1978, p. 2229, vol. 11. Printed in Great Britain.

"$^4A_g \leftrightarrow {}^2E_g$ Transition of $Mn^{4+}$ in $Cs_2TiF_6$ : $MnF_6^{2-}$" by N. B. Manson, G. A. Shah, B. Howes and C. D. Flint; *Molecular Physics*, 1977, p. 1157, vol. 34, No. 4.

* cited by examiner

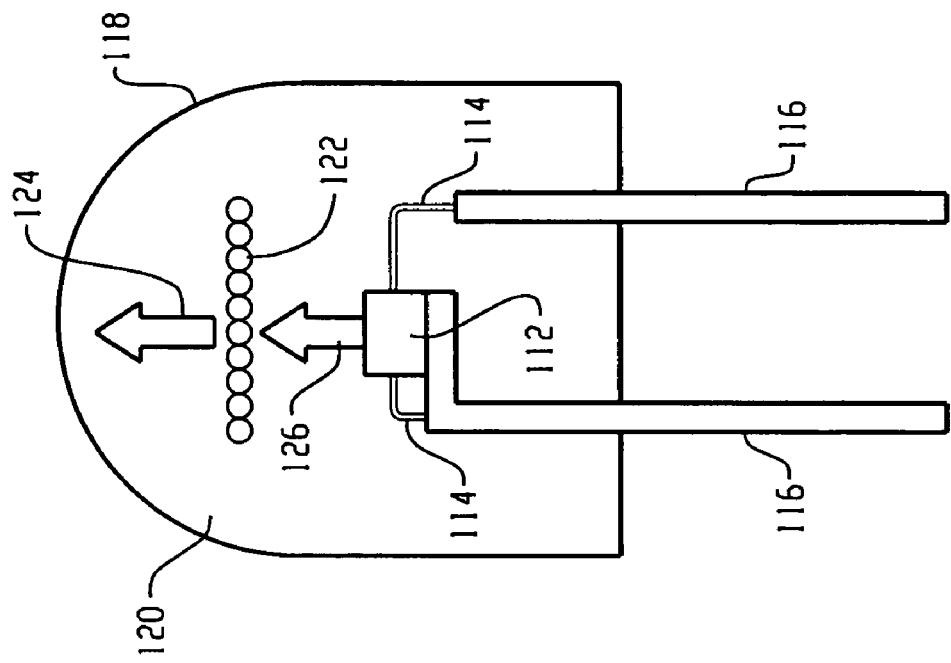
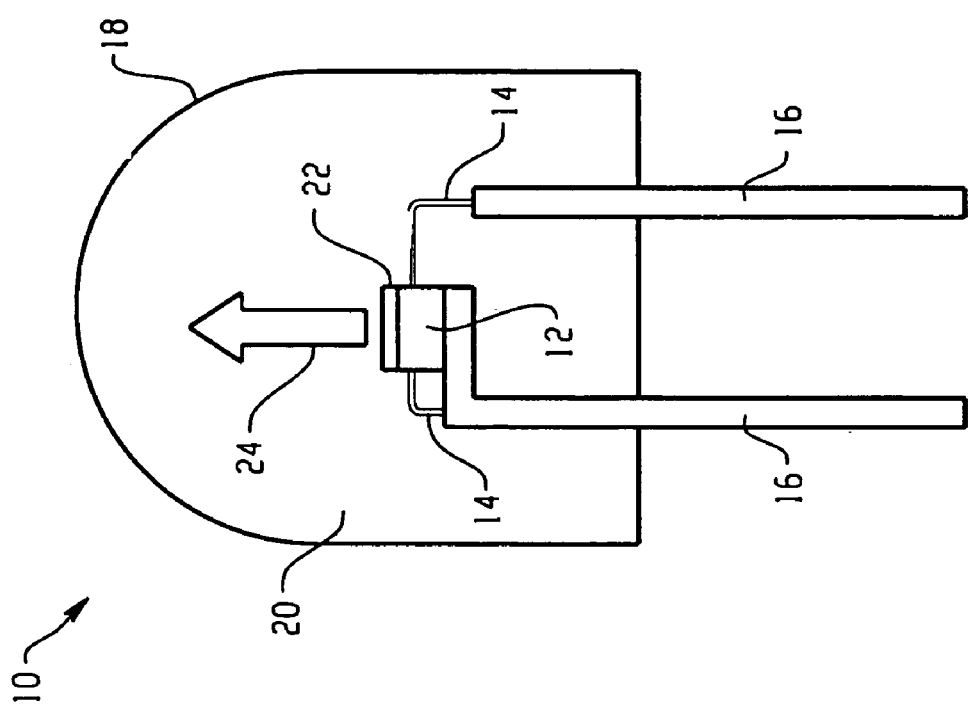

RED LINE EMITTING PHOSPHOR MATERIALS FOR USE IN LED APPLICATIONS

The present application is a continuation-in-part and claims priority from U.S. patent application Ser. Nos. 11/049,598 and 11/285,442, filed on Feb. 2, 2005 and Nov. 22, 2005, respectively.

BACKGROUND OF THE INVENTION

The present exemplary embodiments relate to phosphor compositions, particularly phosphors for use in lighting applications. More particularly, the present embodiments relate to red emitting phosphors and a lighting apparatus employing these phosphors.

Light emitting diodes (LEDs) are semiconductor light emitters often used as a replacement for other light sources, such as incandescent lamps. They are particularly useful as display lights, warning lights and indicator lights or in other applications where colored light is desired. The color of light produced by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complementary color, e.g. a yellowish emission. Together, the blue and yellowish radiation produces a white light. There are also white LEDs that utilize a near UV emitting chip and a phosphor blend including red, green and blue emitting phosphors designed to convert the UV radiation to visible light.

Known white light emitting devices comprise a blue light-emitting LED having a peak emission wavelength in the near blue range (from about 440 nm to about 480 nm) combined with a yellow light-emitting phosphor, such as cerium doped yttrium aluminum garnet ("YAG:Ce") or a cerium doped terbium aluminum garnet ("TAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light as a white light. The total of the light from the phosphor material and the LED chip provides a color point with corresponding color coordinates (x and y) and correlated color temperature (CCT), and its spectral distribution provides a color rendering capability, measured by the color rendering index (CRI).

Such systems can be used to make white light sources having CCTs of >4500 K and CRIs ranging from about 70-82, with luminous efficacy of radiation ("LER", also referred to as luminosity) of about 330 lm/$W_{opt}$. While this range is suitable for many applications, general illumination sources usually require lower CCTs and higher CRIs, preferably with similar or better LER.

Other white light LED lighting systems use a UV or visible light LED chip along with a blend of red, green, and/or blue phosphors that can be efficiently excited by near-UV radiation to make white light.

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature.

As the CCT is lowered and/or the CRI is increased, the LER value generally decreases, leading to values for "warm white" LEDs (of CCT<4500K) significantly lower than those for "cool white" LEDs (of CCT>4500K). The LER values can be improved by using red phosphors having a line emission spectrum, as opposed to red phosphors with a broadband emission. A significant portion of the emitted energy of the latter phosphors tends to fall into the deep red part of the spectrum where the sensitivity of the human eye is very low, thereby decreasing the LER value.

In many white light applications, phosphors with line emission spectra (e.g. $Y_2O_3$: $Eu^{3+}$) are thus preferred as the red component because it maximizes LER at acceptable CRI values (e.g. 80-86), over the CCT range of interest (e.g. 3000-6500K). Current red fluorescent lamp phosphors doped with $Eu^{3+}$ cannot be used successfully in UV LED lamps because they have virtually no absorption of near-UV (370-420 nm) light, leading to unacceptable light loss due to scattering by the phosphor. A deep red line emitting oxyfluoride phosphor, e.g. $3.5MgO.0.5MgF_2.GeO_2$: $Mn^{4+}$ (MFG) can be used in LED lamps, but with considerable impact to LER, due to much of its emission occurring too far in the red region of the spectrum (beyond 650 nm). Other similar phosphors based on oxide and oxyhalide host lattices doped with $Mn^{4+}$ also have a main emission peak at a wavelength greater than 650 nm. It would be preferable to use red phosphors with line emission maxima at lower wavelengths, e.g. in the 610 to 650 nm range, having good absorbance for the LED chip emitting in the UV to blue range. This improves the LER while maintaining the general CRI at 80 or above.

Thus, a continuing need exists for new red line-emitting phosphors and their blends for use in conjunction with UV and visible LED chips displaying high quantum efficiency to produce white-light LEDs having both a high CRI and an improved LER at any given CCT.

BRIEF SUMMARY

In a first aspect, there is provided a light emitting device including a semiconductor light source and a complex fluoride phosphor material activated with $Mn^{4+}$. In one embodiment, the complex fluoride phosphor may comprise at least one of: (1) $A_2[MF_6]:Mn^{4+}$, where A is selected from Li, Na, K, Rb, Cs, $NH_4$, and combinations thereof; and where M is selected from Ge, Si, Sn, Ti, Zr, and combinations thereof; (2) $E[MF_6]:Mn^{4+}$, where E is selected from Mg, Ca, Sr, Ba, Zn, and combinations thereof; and where M is selected from Ge, Si, Sn, Ti, Zr, and combinations thereof; (3) $Ba_{0.65}Zr_{0.35}F_{2.70}$: $Mn^{4+}$; or (4) $A_3[ZrF_7]:Mn^{4+}$ where A is selected from Li, Na, K, Rb, Cs, $NH_4$, and combinations thereof.

In a second aspect, there is provided a phosphor blend including at least one of the above complex fluoride phosphors activated with $Mn^{4+}$ and at least one additional phosphor.

In a third aspect, there is provided a phosphor material including at least one of: (1) $A_2[MF_6]:Mn^{4+}$, where A is selected from Li, Na, Rb, Cs, $NH_4$, and combinations thereof; and where M is selected from Ge, Si, Ti, and combinations thereof; (2) $A_2[MF_6]:Mn^{4+}$, where A is selected from Li, Na, K, Rb, Cs, $NH_4$, and combinations thereof; and where M is selected from Sn, Zr, and combinations thereof; (3) $E[MF_6]$: $Mn^{4+}$, where E is selected from Mg, Ca, Sr, Ba, Zn, and combinations thereof; and where M is selected from Ge, Si, Sn, Ti, Zr, and combinations thereof; (4) $A_3[ZrF_7]:Mn^{4+}$ where A is selected from Li, Na, K, Rb, Cs, $NH_4$, and combinations thereof; and/or (5) $Ba_{0.65}Zr_{0.35}F_{2.70}:Mn^{4+}$.

BRIEF DESCRIPTION OF THE DRAWINGS

FIG. 1 is a schematic cross-sectional view of an illumination system in accordance with one embodiment of the present invention.

FIG. 2 is a schematic cross-sectional view of an illumination system in accordance with a second embodiment of the present invention.

DETAILED DESCRIPTION OF THE EXEMPLARY EMBODIMENTS

Figure 4:
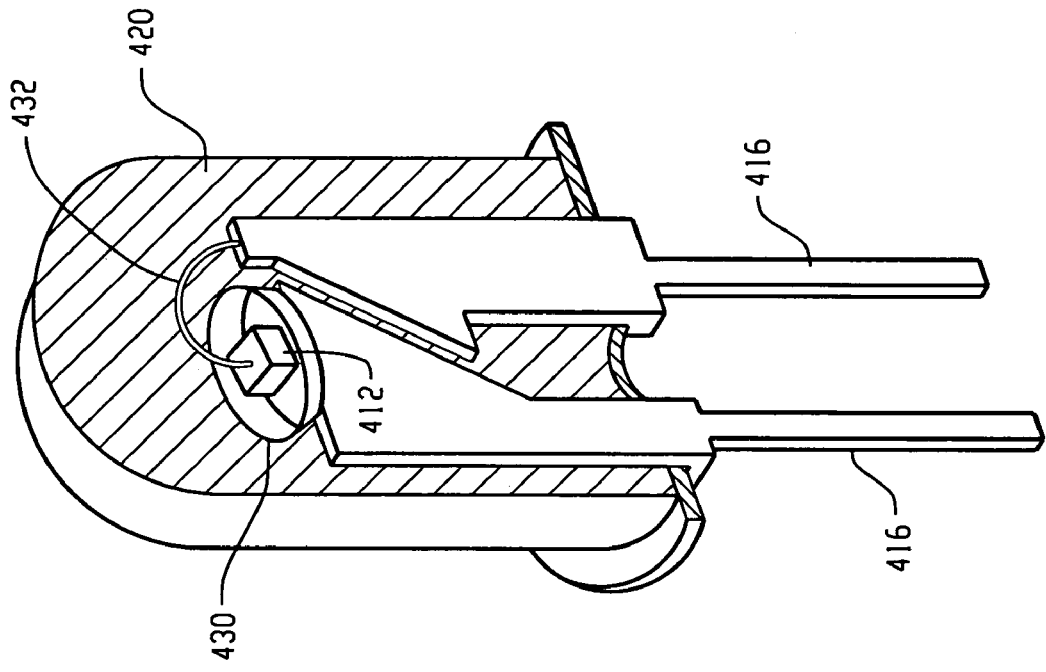
FIG. 4 is a cutaway side perspective view of an illumination system in accordance with a fourth embodiment of the present invention.

Phosphors convert radiation (energy) to visible light. Different combinations of phosphors provide different colored light emissions. Novel phosphor compositions and blends are presented herein as well as their use in LED and other light sources.

The color of the generated visible light is dependent on the particular components of the phosphor material. The phosphor material may include only, a single phosphor composition or two or more phosphors of basic color, for example a particular mix with one or more of a yellow and red phosphor to emit a desired color (tint) of light. As used herein, the terms "phosphor" and "phosphor material" may be used to denote both a single phosphor composition as well as a blend of two or more phosphor compositions.

It was determined that an LED lamp that produces a white light would be useful to impart desirable qualities to LEDs as light sources. Therefore, in one embodiment, a luminescent material phosphor conversion material blend (phosphor blend) coated LED chip is disclosed for providing white light. The phosphor blends presented in this embodiment enable white light with an optimal combination of CRI and LER at any CCT of interest, when excited by radiation from about 250 to 550 nm as emitted by a near UV to green LED.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred peak emission of the LED chip in the present invention will depend on the identity of the phosphors in the disclosed embodiments and may range from, e.g., 250-550 nm. In one preferred embodiment, however, the emission of the LED will be in the near UV to blue-green region and have a peak wavelength in the range from about 370 to about 500 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 550 nm.

Preferably, the LED may contain at least one semiconductor layer comprising GaN, ZnO or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other material having a high index of refraction. In one embodiment, the encapsulant material 20 is a polymer material, such as epoxy, silicone, or silicone epoxy, although other organic or inorganic encapsulants may be used. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so that at least part of the radiation emitted from one is transmitted to the other.

This phosphor material 22 is deposited on the LED 12 by any appropriate method. For example, a suspension of the phosphor(s) can be formed, and applied as a phosphor layer to the LED surface. In one such method, a silicone, epoxy or other matrix material is used (either directly or diluted with an organic solvent, e.g. acetone, MIBK or butyl acetate) to create a slurry in which the phosphor particles are randomly suspended and placed around the LED. This method is merely exemplary of possible positions of the phosphor material 22 and LED 12. Thus, the phosphor material 22 may be coated over or directly on the light emitting surface of the LED chip 12 by coating and drying or curing the phosphor suspension over the LED chip 12. Both the shell 18 and the encapsulant 20 should be transparent to allow light 24 to be transmitted through those elements. Although not intended to be limiting, the median particle size of the phosphor material as measured using light scattering methods or via microscope (electron or optical) measurements may be from about 1 to about 20 microns.

FIG. 2 illustrates a second preferred structure of the system according to the preferred aspect of the present invention. Corresponding numbers from FIGS. 1-4 (e.g. 12 in FIG. 1 and 112 in FIG. 2) relate to corresponding structures in each of the figures unless otherwise stated. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding.

Figure 3:
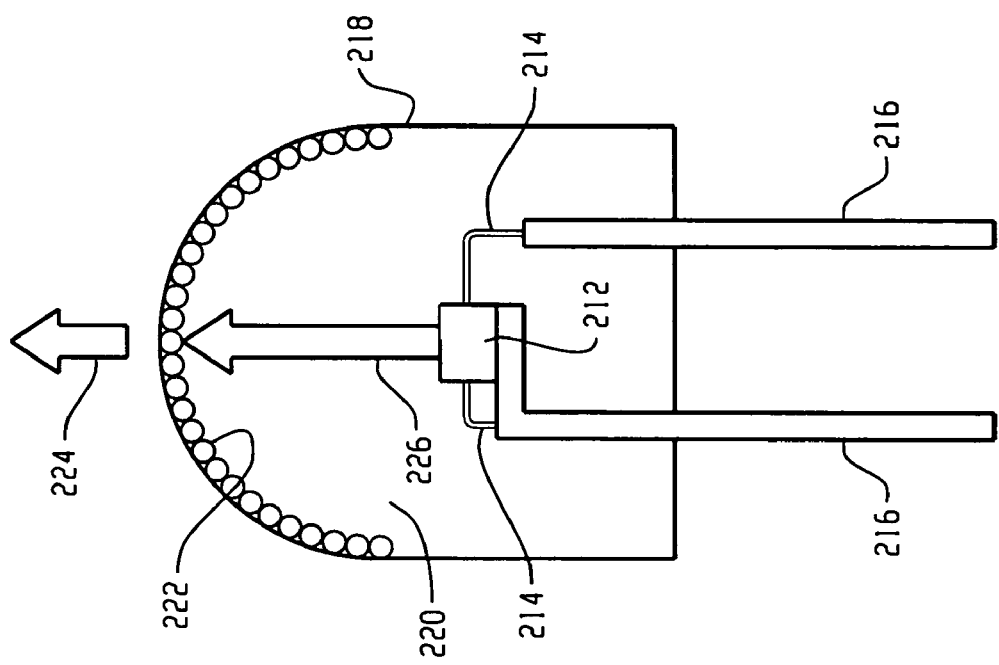
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, there is provided a novel phosphor material, which may be used in the phosphor composition 22 in the above described LED light. The phosphor material is a complex fluoride phosphor activated with $Mn^{4+}$ and may comprise one or more of (1) $A_2[MF_6]:Mn^{4+}$, where A is selected from Li, Na, Rb, Cs, $NH_4$, and combinations thereof; and where M is selected from Ge, Si, Ti, and combinations thereof; (2) $A_2[MF_6]:Mn^{4+}$, where A is selected from Li, Na, K, Rb, Cs, $NH_4$, and-combinations thereof; and where M is selected from Sn, Zr, and combinations thereof; (3) $E[MF_6]:Mn^{4+}$, where E is selected from Mg, Ca, Sr, Ba, Zn, and combinations thereof; and where M is selected from Ge, Si, Sn, Ti, Zr, and combinations thereof; (4) $A_3[ZrF_7]:Mn^{4+}$ where A is selected from Li, Na, K, Rb, Cs, $NH_4$, and combinations thereof; and/or (5) $Ba_{0.65}Zr_{0.35}F_{2.70}:Mn^{4+}$.

By "complex fluoride phosphor", it is meant that the phosphor is a coordination compound, containing at least one coordination center (e.g. M in the examples above), surrounded by fluoride ions acting as ligands, and charge-compensated by counter ions (e.g. A or E in the examples above) as necessary. Complex fluorides are occasionally written down as a combination of simple, binary fluorides (e.g. $EF_2.MF_4$ instead of $E[MF_6]$), but such a representation does not indicate the coordination number (in this example, 6) for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, e.g. M. The host lattice (including the counter ions) can further modify the excitation and emission properties of the activator ion.

When used with an LED chip emitting at from 250 to 550 nm and one or more additional phosphors (such as blue and green emitting phosphors), the use of the above phosphor material allows for a white LED. The additional phosphors that can be used with the above described phosphors are described in more detail below.

Exemplary $Mn^{4+}$ activated compositions of this embodiment are detailed below Table 1.

TABLE 1

| ID # | Phosphor | Raw materials |
|---|---|---|
| 1 | $K_2[SiF_6]:Mn^{4+}$ | $K_2[SiF_6]$ |
|   |   | $K_2[MnF_6]$ |
| 2 | $K_2[TiF_6]:Mn^{4+}$ | $K_2[TiF_6]$ |
|   |   | $K_2[MnF_6]$ |
| 3 | $K_3[ZrF_7]:Mn^{4+}$ | $K_3[ZrF_7]$ |
|   |   | $K_2[MnF_6]$ |
| 4 | $Ba_{0.65}Zr_{0.35}F_{2.70}:Mn^{4+}$ | $Zr(OH)_4$ |
|   |   | $BaCO_3$ |
|   |   | $K_2[MnF_6]$ |
| 5 | $Ba[TiF_6]:Mn^{4+}$ | $TiO_2$ |
|   |   | $BaCO_3$ |
|   |   | $K_2[MnF_6]$ |
| 6 | $K_2[SnF_6]:Mn^{4+}$ | $K_2SnO_3 \cdot 3H_2O$ |
|   |   | $K_2[MnF_6]$ |
| 7 | $Na_2[TiF_6]:Mn^{4+}$ | $Na_2[TiF_6]$ |
|   |   | $K_2[MnF_6]$ |
| 8 | $Na_2[ZrF_6]:Mn^{4+}$ | $Na_2[ZrF_6]$ |
|   |   | $K_2[MnF_6]$ |

Complex fluoride phosphors doped with $Mn^{4+}$ with a coordination number of 6 for the coordination center (i.e. in a generally octahedral environment, as in $K_2[TiF_6]:Mn^{4+}$) are particularly preferred. Other complex fluorides with higher coordination numbers for the central ion (e.g. $K_3[ZrF_7]$ with a coordination number of 7) are also applicable as host lattices for activation with $Mn^{4+}$.

Figure 5:
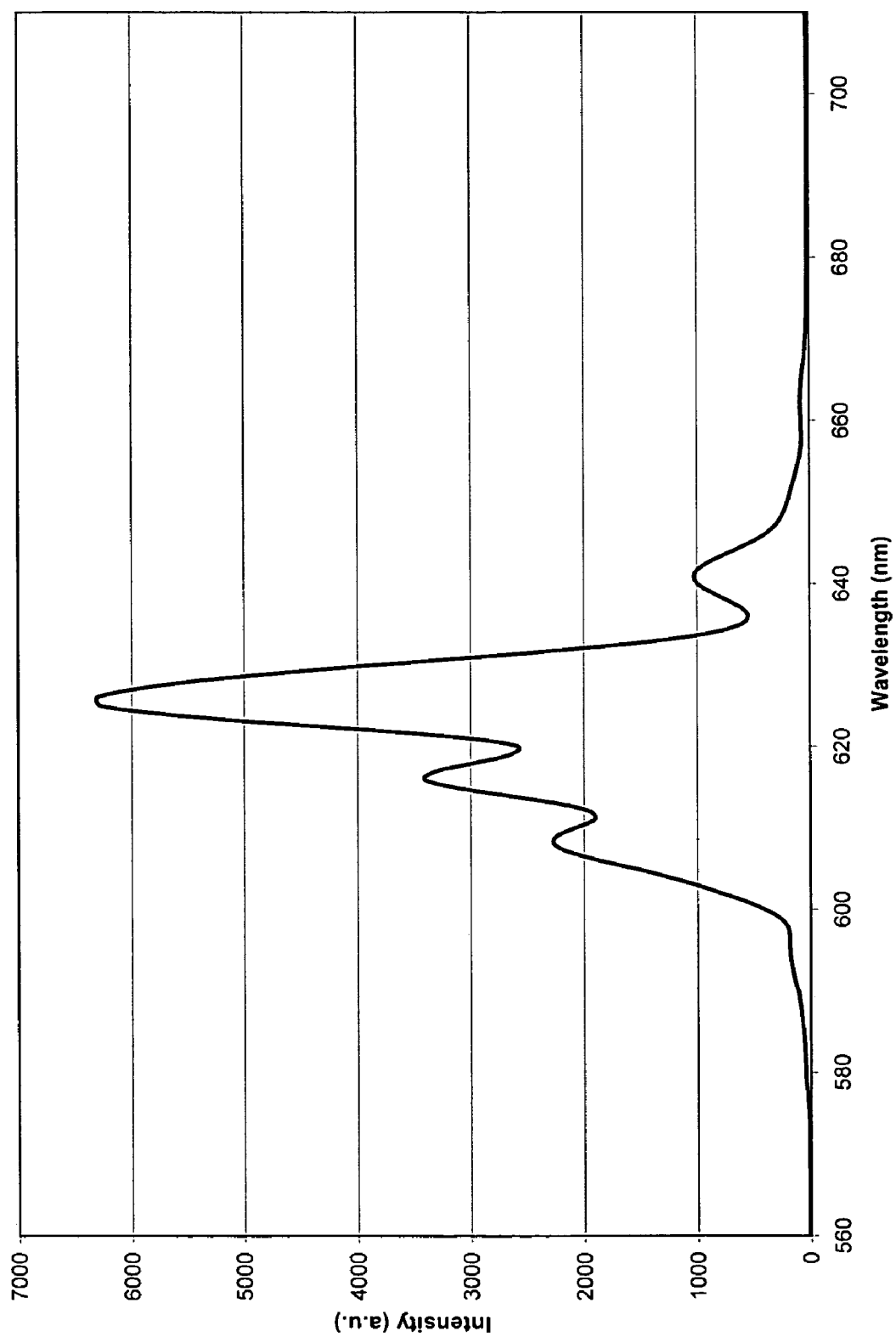
FIG. 5 is a graph of the emission spectrum of a $Na_2[TiF_6]$: $Mn^{4+}$ phosphor.
Figure 6:
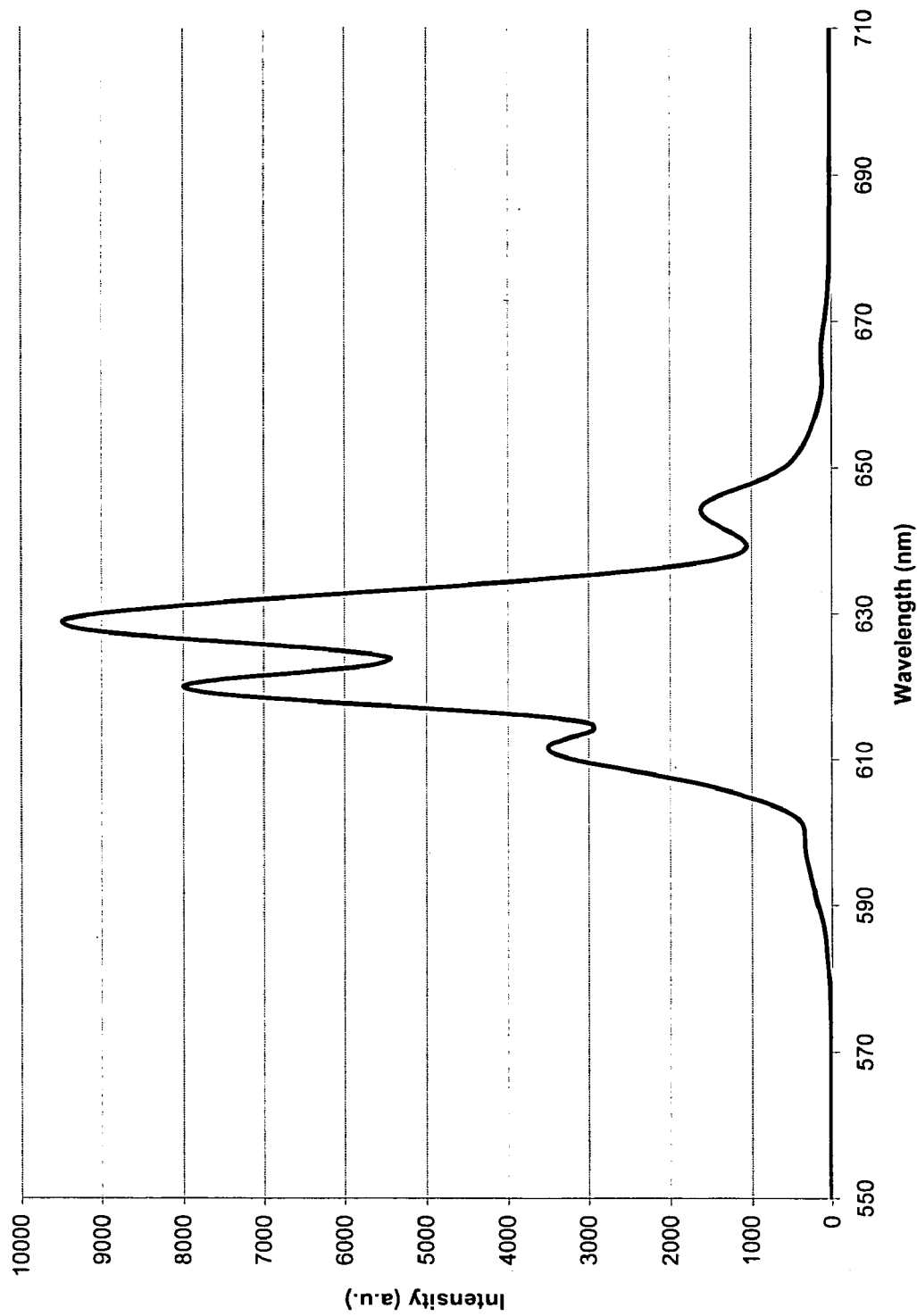
FIG. 6 is a graph of the emission spectrum of a $K_2[SnF_6]$: $Mn^{4+}$ phosphor.
Figure 7:
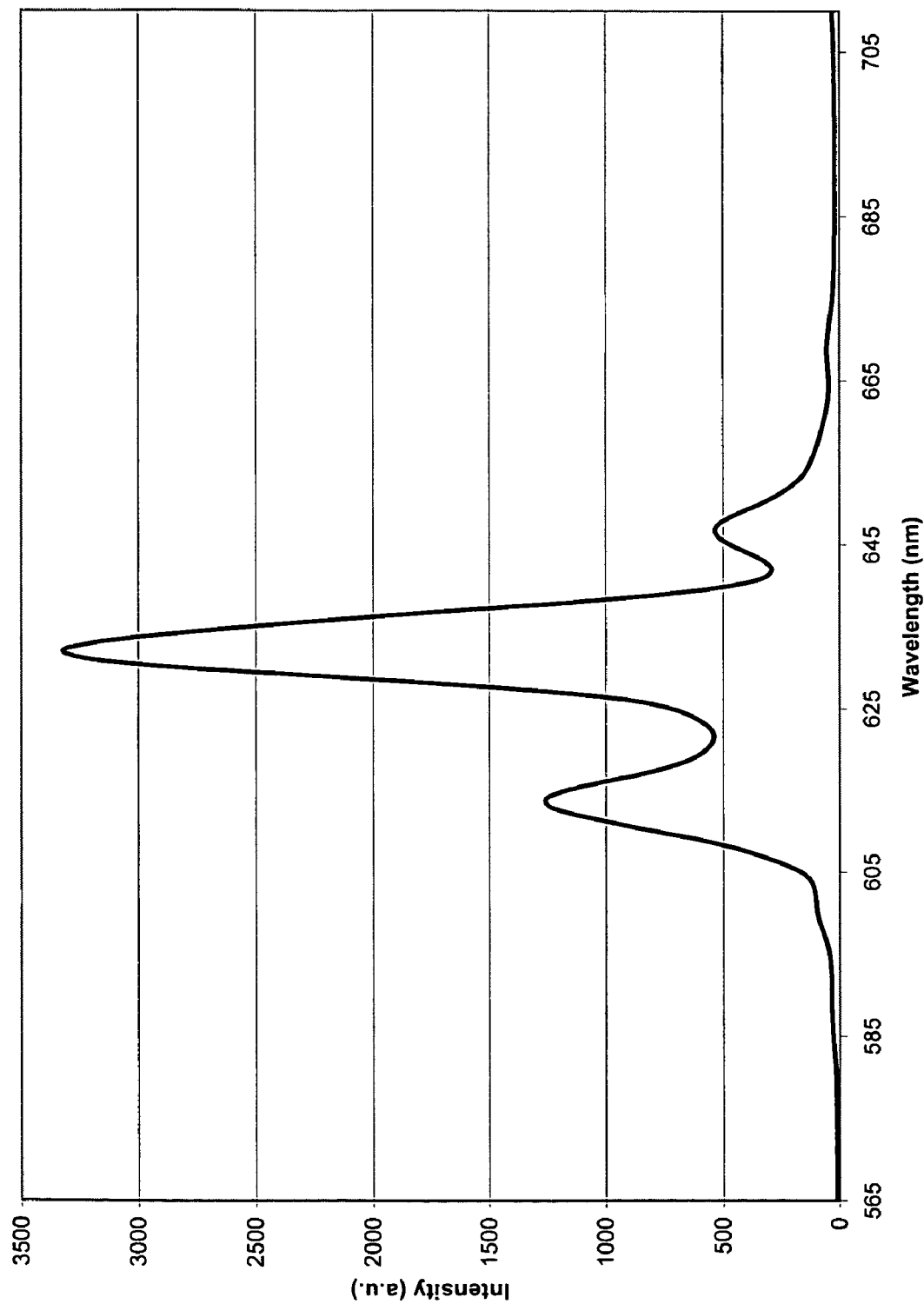
FIG. 7 is a graph of the emission spectrum of a $Ba[TiF_6]$: $Mn^{4+}$ phosphor.
Figure 8:
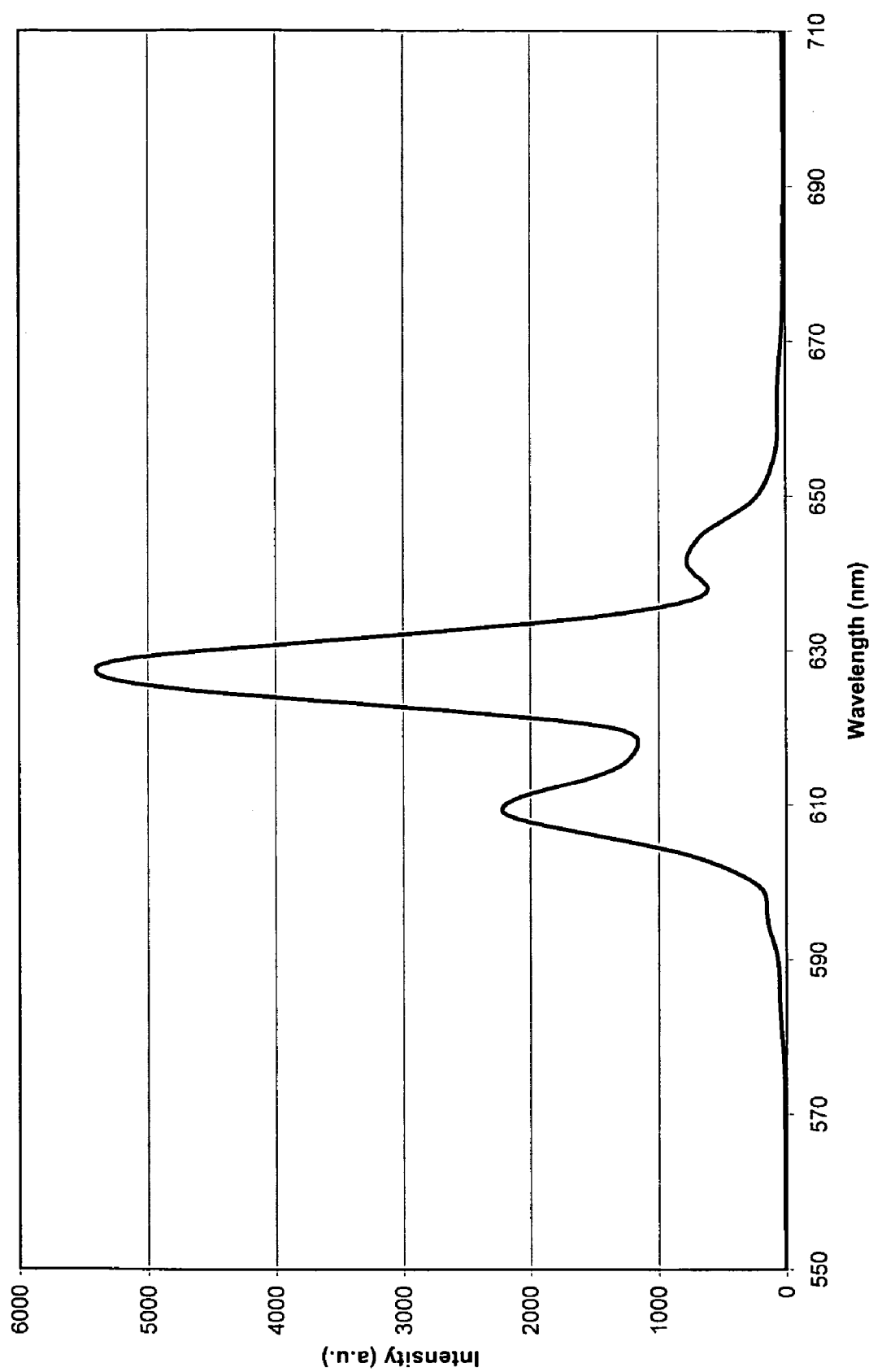
FIG. 8 is a graph of the emission spectrum of a $K_3[ZrF_7]$: $Mn^{4+}$ phosphor.

FIGS. 5-9 show the emission spectra of several of these phosphors when excited by 365 nm UV light. That is, FIG. 5 is a graph of the emission spectrum of a $Na_2[TiF_6]:Mn^{4+}$ phosphor. FIG. 6 is a graph of the emission spectrum of a $K_2[SnF_6]:Mn^{4+}$ phosphor. FIG. 7 is a graph of the emission spectrum of $Ba[TiF_6]:Mn^{4+}$ phosphor. FIG. 8 is a graph of the emission spectrum of a $K_3[ZrF_7]:Mn^{4+}$ phosphor.

The above described complex fluoride phosphor compositions activated with $Mn^{4+}$ can be prepared by taking the raw materials shown in Table 1 in a ratio sufficient to ensure the desired incorporation level of the activator ion (e.g. between 0.1 and 30 mol. % of the total M content, more preferably between 2 and 15 mol %). The raw materials are dissolved together in aqueous hydrofluoric acid (e.g. 30 to 50% HF by weight) and the phosphor is produced by evaporation of the reaction mixture to dryness in a plastic or Teflon-lined vessel, preferably with continuous heating below the boiling point of the solution—e.g. on a water bath. The crude phosphor may be then milled (preferably dry-milled) to a desired particle size, washed with an organic solvent (e.g. ethanol or acetone) to remove any remaining amounts of HF and dried on the air prior to use in LEDs.

A variety of other starting materials may be used to produce the complex fluoride phosphors in this embodiment via co-crystallization from aqueous solution of HF and/or other fluorides (e.g. prepared in-situ or ex-situ from oxides, hydroxides, alkoxides, carbonates and binary fluorides or hydrogen fluorides of the A, E or M constituents), and permanganates or manganates with a stoichiometric amount of $H_2O_2$ or other peroxide to provide the Mn activator in the proper oxidation state (+4). The examples of complex fluoride phosphors doped with $Mn^{4+}$ shown herein are not meant to be limiting. Other constituent ions may be used to build the complex fluoride host lattice (as the coordination center or the counter ion), provided they do not introduce electronic or vibrational transitions deleterious to the phosphor excitation and/or emission upon activation with $Mn^{4+}$.

The relative amounts of each phosphor in the phosphor material can be described in terms of spectral weight. The spectral weight is the relative amount that each phosphor contributes to the overall emission spectra of the phosphor blend. The spectral weight amounts of all the individual phosphors should add up to 1. A preferred blend comprises a spectral weight of from 0.01 to 0.80 of a phosphor with an emission maximum of from about 500 to 610 nm, from 0 to 0.19 of an optional phosphor with an emission maximum from about 430 to 500 nm (which would not be needed for excitation with a blue or blue-green LED having an emission maximum from about 430 to about 500 nm), and the balance of the blend being one of the above described complex fluoride phosphors, as needed to achieve the targeted CCT value. Any known phosphors suitable for use in near-UV to green LED systems and emitting in the above wavelength ranges may be used. Garnets activated with at least $Ce^{3+}$ (e.g. YAG:Ce, TAG:Ce and their compositional modifications known in the art) are particularly preferred phosphors with an emission maximum at about 500 to 610 nm. Other particularly preferred phosphors with an emission maximum in the latter range are alkaline earth orthosilicates activated with at least $Eu^{2+}$, e.g. $(Ba,Sr,Ca)_2SiO_4:Eu^{2+}$ ("BOS") and its compositional modifications known in the art.

It should be noted that various phosphors are described herein in which different elements enclosed in parentheses and separated by commas, such as in the case of $(Ba,Sr,Ca)_2SiO_4:Eu^{2+}$. As understood by those skilled in the art, this type of notation means that the phosphor can include any or all of those specified elements in the formulation in any ratio. That is, this type of notation for the above phosphor, for example, has the same meaning as $(Ba_aSr_bCa_{1-a-b})_2SiO_4:Eu^{2+}$, where a and b can each vary independently from 0 to 1, including the values of 0 and 1.

Figure 9:
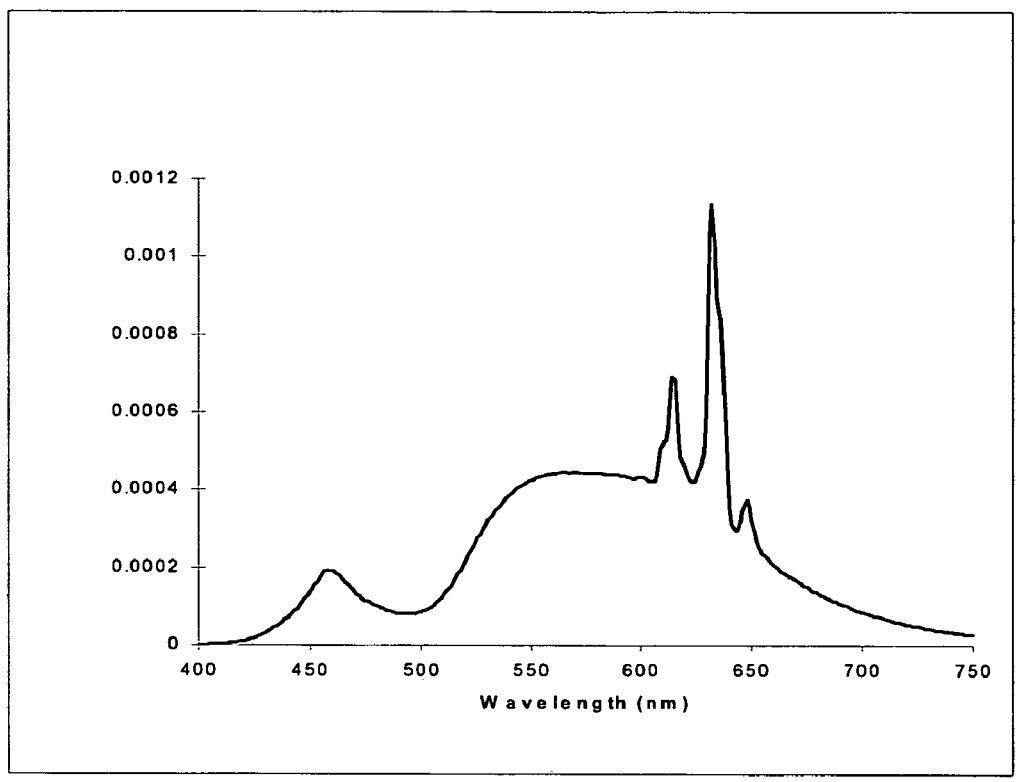
FIG. 9 is the power distribution spectrum of an LED device using a present embodiment phosphor blend.
Figure 10:
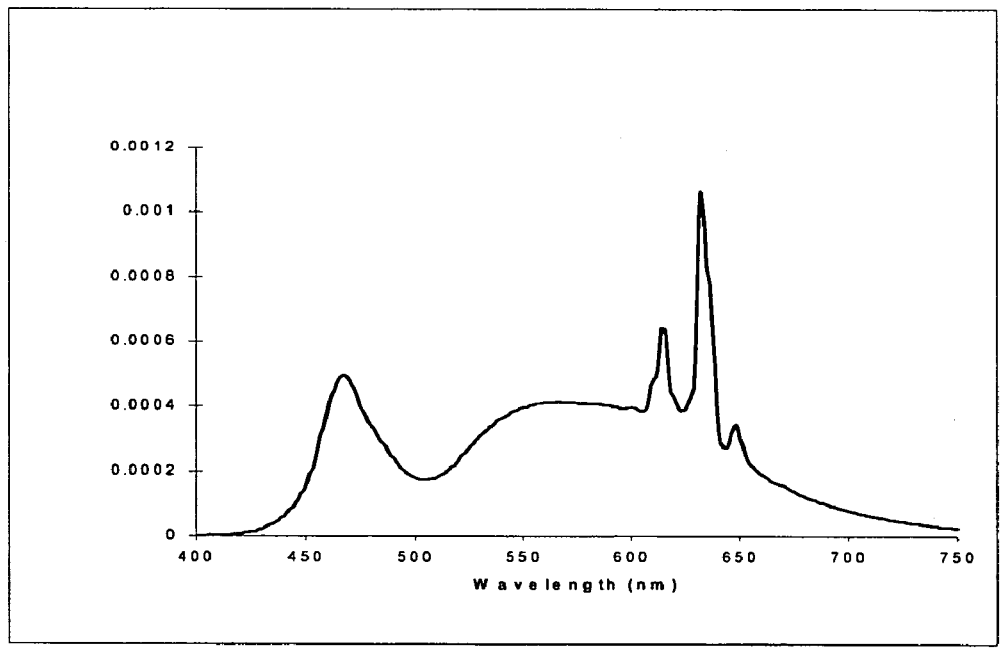
FIG. 10 is the power distribution spectrum of a second LED device using a present embodiment phosphor blend.

Depending on the identity of the specific phosphors, exemplary lighting apparatuses may be produced having CRI ($R_a$) values greater than 80, preferably >90, and CCT values<4500K, preferably <4000K. The spectrum of an experimental LED having a CCT of 2900K, $R_a$ of 82 and LER of 342 lm/$W_{opt}$ is shown in FIG. 9. The spectrum of a second experimental LED having a CCT of 3500K, $R_a$ of 92 and LER of 312 lm/$W_{opt}$ is shown in FIG. 10. Both of these LEDs use a blue chip with a terbium aluminum garnet phosphor activated with $Ce^{3+}$ ($Tb_{2.91}Ce_{0.09}Al_{4.90}O_{11.85}$) and a red line emitting complex fluoride phosphor ($K_2[TiF_6]:Mn^{4+}$) from Example 1 below.

"In an embodiment, the invention provides a lighting apparatus for emitting white light comprising a semiconductor light source; and a phosphor material radiationally coupled to the light source, the phosphor material comprising a complex fluoride phosphor activated with $Mn^{4+}$ and one or more additional phosphors having an emission maximum in the range of 430 to 500 nm."

"In an embodiment, the invention provides a lighting apparatus for emitting white light comprising a semiconductor light source; and a phosphor material radiationally coupled to the light source, the phosphor material comprising a complex fluoride phosphor activated with $Mn^{4+}$ and one or more additional phosphors. The white light lighting apparatus produces white light with a general CRI greater than 90."

In addition, other phosphors emitting throughout the visible spectrum region, at wavelengths substantially different from those of the phosphors described in the present invention, may be used in the blend to customize the white color of the resulting light and produce sources with improved light quality. While not intended to be limiting, suitable phosphors for use in the blend with the present phosphors include:

$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$(Sr,Ca)_{10}(PO_4)_6 \cdot vB_2O_3:Eu^{2+}$ (wherein $0<v\leq 1$)
$Sr_2Si_3O_8 \cdot 2SrCl_2:Eu^{2+}$
$(Ca,Sr,Ba)_3MgSi_2O_8:Eu^{2+},Mn^{2+}$
$BaAl_8O_{13}:Eu^{2+}$
$2SrO \cdot 0.84P_2O_5 \cdot 0.16B_2O_3:Eu^{2+}$
$(Ba,Sr,Ca)MgAl_{10}O_{17}:Eu^{2+},Mn^{2+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2Si_{1-\xi}O_{4-2\xi}:Eu^{2+}$ (wherein $0\leq\xi\leq 0.2$)
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Sc,Al,Ga)_{5-\alpha}O_{12-3/2\alpha}:Ce^{3+}$ (wherein $0\leq\alpha\leq 0.5$)
$(Lu,Sc,Y,Tb)_{2-u-v}Ce_vCa_{1+u}Li_wMg_{2-w}P_w(Si,Ge)_{3-w}O_{12-u/2}$ where $-0.5\leq u\leq 1$; $0<v\leq 0.1$; and $0\leq w\leq 0.2$
$(Ca,Sr)_8(Mg,Zn)(SiO_4)_4Cl_2:Eu^{2+}Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$ZnS:Cu^+,Cl^-$
$ZnS:Cu^+,Al^{3+}$
$ZnS:Ag^+,Cl^-$
$ZnS:Ag^+,Al^{3+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_\beta Si_\gamma N_\mu:Eu^{2+}$ (wherein $2\beta+4\gamma=3\mu$)
$Ca_3(SiO_4)Cl_2:Eu^{2+}$
$(Y,Lu,Gd)_{2-\phi}Ca_\phi Si_4N_{6+\phi}C_{1-\phi}:Ce^{3+}$ (wherein $0\leq\phi\leq 0.5$)
$(Lu,Ca,Li,Mg,Y)$alpha-SiAlON doped with $Eu^{2+}$ and/or $Ce^{3+}$
$(Ca,Sr,Ba)SiO_2N_2:Eu^{2+},Ce^{3+}$
$3.5MgO \cdot 0.5MgF_2 \cdot GeO_2:Mn^{4+}$
$Ca_{1-c-f}Ce_cEu_fAl_{1+c}Si_{1-c}N_3$, (where $0<c\leq 0.2$, $0\leq f\leq 0.2$)
$Ca_{1-h-r}Ce_hEu_rAl_{1-h}(Mg,Zn)_hSiN_3$, (where $0<h\leq 0.2$, $0\leq r\leq 0.2$)
$Ca_{1-2s-t}Ce_s(Li,Na)_sEu_tAlSiN_3$, (where $0\leq s\leq 0.2$, $0\leq f\leq 0.2$, $s+t>0$)
$Ca_{1-\sigma-\chi-\phi}Ce_\sigma(Li,Na)_\chi Eu_\phi Al_{1+\sigma\chi}Si_{1-\sigma+\chi}N_3$, (where $0\leq\sigma\leq 0.2$, $0<\chi\leq 0.4$, $0\leq\phi\leq 0.2$)

For purposes of the present application, it should be understood that when a phosphor has two or more dopant ions (i.e. those ions following the colon in the above compositions), this is to mean that the phosphor has at least one (but not necessarily all) of those dopant ions within the material. That is, as understood by those skilled in the art, this type of notation means that the phosphor can include any or all of those specified ions as dopants in the formulation.

When the phosphor composition includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. Preferably, the color point of the white light will lie on or substantially on the Planckian (also known as the blackbody) locus, e.g. within 0.020 units in the vertical (y) direction of the 1931 CIE chromaticity diagram, more preferably within 0.010 units in the vertical direction. As stated, however, the identity and amounts of each phosphor in the phosphor composition can be varied according to the needs of the end user. Since the efficiency of individual phosphors may vary widely between suppliers, the exact amounts of each phosphor needed are best determined empirically, e.g. through standard design of experiment (DOE) techniques.

It may be desirable to add pigments or filters to the phosphor composition. When the LED is a UV emitting LED, the phosphor layer 22 may also comprise from 0 up to about 10% by weight (based on the total weight of the phosphors) of a pigment or other UV absorbent material capable of absorbing or reflecting UV radiation having a wavelength between 200 nm and 450 nm.

Suitable pigments or filters include any of those known in the art that are capable of absorbing radiation generated between 200 nm and 450 nm. Such pigments include, for example, nickel titanate or praseodymium zirconate. The pigment may be used in an amount effective to filter 10% to 100% of the radiation generated in the 200 nm to 500 nm range.

EXAMPLES

Example 1

Preparation of $K_2[TiF_6]:Mn^{4+}$ Phosphor

The raw materials (18.48 g of $K_2[TiF_6]$, obtained commercially from Fluka and 1.52 g of $K_2[MnF_6]$, prepared according to Bode's method [H. Bode, H. Jenssen, F. Bandte, Angew. Chem., N11(1953), 304] were dissolved in 200 ml of aqueous 40% HF while stirring under heating. The solution was evaporated in a plastic dish on a water bath to dryness. As noted above with reference to FIGS. 9 and 10, LEDs using a blue chip with a terbium aluminum garnet activated with $Ce^{3+}$ ($Tb_{2.91}Ce_{0.09}Al_{4.90}O_{11.85}$) and the present red line emitting phosphor ($K_2[TiF_6]:Mn^{4+}$) were produced.

Example 2

Preparation of $Ba[TiF_6]:Mn^{4+}$ Phosphor $K_2[MnF_6]$ (1.34 g) was dissolved in 100 ml of aqueous 40% HF with stirring, followed by $TiO_2$ hydrate (prepared by hydrolysis of tetraisopropyl orthotitanate in distilled water and equivalent to 4.90 g of pure $TiO_2$ according to the loss on ignition method). Solid $BaCO_3$ (12.30 g) was then added gradually to the stirred solution. The resulting suspension was evaporated to dryness on a water bath.

Example 3

Preparation of K$_3$[ZrF$_7$]:Mn$^{4+}$ Phosphor

The raw materials (19.27 g of manufactured K$_3$[ZrF$_7$] and 0.73 g of K$_2$[MnF$_6$]) were dissolved in 200 ml of aqueous 40% HF while stirring under heating. The solution was evaporated in a plastic dish on a water bath to dryness.

Example 4

Preparation of Ba$_{0.65}$Zr$_{0.35}$F$_{2.70}$: Mn$^{4+}$ Phosphor

Solid BaCO$_3$ (11.52 g) and Zr(OH)$_4$ (9.30 g) were added gradually to 200 ml of aqueous 40% HF with stirring. The slurry was heated for 30 min. on a water bath. The resulting precipitate of Ba$_{0.65}$Zr$_{0.35}$F$_{2.70}$ was washed with deionized water through decantation until neutral pH and dried at 100° C. K$_2$[MnF$_6$] (1.13 g) was dissolved in 200 ml of aqueous 40% HF suspension of Ba$_{0.65}$Zr$_{0.35}$F$_{2.70}$ (18.87 g) while stirring and then heated on a water bath until a dry residue was formed.

Apart from white light blends for general illumination, these phosphors can be used either individually or in blends for LEDs for traffic signals, signage, and LCD backlighting applications. The narrow red line emission allows for a saturated color that is highly desirable for these applications.

The phosphor materials described above may be used in additional applications besides LEDs. For example, the material may be used as a phosphor in a fluorescent lamp, in a cathode ray tube, in a plasma display device or in a liquid crystal display (LCD). These uses are meant to be merely exemplary and not exhaustive.

The present development has been described with reference to various exemplary embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus comprising:
   a semiconductor light source; and
   a phosphor material radiationally coupled to the light source, the phosphor material comprising a complex fluoride phosphor-activated with Mn$^{4+}$.

2. The lighting apparatus of claim 1, wherein said phosphor material comprises at least one of:
   (A) A$_2$[MF$_6$]:Mn$^{4+}$, where A is selected from Li, Na, K, Rb, Cs, NH$_4$, and combinations thereof; and where M is selected from Ge, Si, Sn, Ti, Zr, and combinations thereof;
   (B) E[MF$_6$]:Mn$^{4+}$, where E is selected from Mg, Ca, Sr, Ba, Zn, and combinations thereof; and where M is selected from Ge, Si, Sn, Ti, Zr, and combinations thereof;
   (C) Ba$_{0.65}$Zr$_{0.35}$F$_{2.70}$:Mn$^{4+}$; or
   (D) A$_3$[ZrF$_7$]:Mn$^{4+}$ where A is selected from Li, Na, K, Rb, Cs, NH$_4$, and combinations thereof.

3. The lighting apparatus of claim 1, wherein the light source is a semiconductor light emitting diode (LED) emitting radiation having a peak wavelength in the range of from about 370 to about 500 nm.

4. The lighting apparatus of claim 1, wherein said semiconductor light source comprises a nitride compound semiconductor represented by the formula In$_i$Ga$_j$Al$_k$N, where $0 \leq i$; $0 \leq j$, $0 \leq k$, and $i+j+k=1$.

5. The lighting apparatus of claim 1, wherein the light source is an organic emissive structure.

6. The lighting apparatus of claim 1, wherein the phosphor material is coated on the surface of the light source.

7. The lighting apparatus of claim 1, further comprising an encapsulant surrounding the light source and the phosphor material.

8. The lighting apparatus of claim 1, wherein the phosphor material is dispersed in the encapsulant.

9. The lighting apparatus of claim 1, further comprising a reflector cup.

10. The lighting apparatus of claim 1, wherein said phosphor material further comprises one or more additional phosphors.

11. The lighting apparatus of claim 10, wherein said one or more additional phosphors has an emission maximum in the range of 430 to 500 nm.

12. The lighting apparatus of claim 10, wherein said one or more additional phosphors has an emission maximum in the range of 500 to 610 nm.

13. The lighting apparatus of claim 12, wherein said one or more additional phosphors is one or more of a garnet activated with Ce$^{3+}$ or an alkaline earth orthosilicate activated with Eu$^{2+}$.

14. The lighting apparatus of claim 10, wherein said one or more additional phosphors are selected from the group including: (Ba,Sr,Ca)$_5$(PO$_4$)$_3$(Cl,F,Br,OH):Eu$^{2+}$,Mn$^{2+}$; (Ba,Sr,Ca)BPO$_5$:Eu$^{2+}$, Mn$^{2+}$; (Sr,Ca)$_{10}$(PO$_4$)$_6$.vB$_2$O$_3$:Eu$^{2+}$ (wherein $0<v\leq 1$); Sr$_2$Si$_3$O$_8$.2SrCl$_2$:Eu$^{2+}$; (Ca,Sr,Ba)$_3$MgSi$_2$O$_8$:Eu$^{2+}$,Mn$^{2+}$; BaAl$_8$O$_{13}$:Eu$^{2+}$; 2SrO.0.84P$_2$O$_5$.0.16B$_2$O$_3$:Eu$^{2+}$; (Ba,Sr,Ca)MgAl$_{10}$O$_{17}$:Eu$^{2+}$,Mn$^{2+}$; (Ba,Sr,Ca)Al$_2$O$_4$:Eu$^{2+}$; (Y,Gd,Lu,Sc,La)BO$_3$:Ce$^{3+}$,Tb$^{3+}$; ZnS:Cu$^+$,Cl$^-$; ZnS:Cu$^+$,Al$^{3+}$; ZnS:Ag$^+$,Cl$^-$; ZnS:Ag$^+$,Al$^{3+}$; (Ba,Sr,Ca)$_2$Si$_{1-\xi}$O$_{4-2\xi}$:Eu$^{2+}$ (wherein $0 \leq \xi \leq 0.2$); (Ba,Sr,Ca)$_2$(Mg,Zn)Si$_2$O$_7$:Eu$^{2+}$; (Sr,Ca,Ba)(Al,Ga,In)$_2$S$_4$:Eu$^{2+}$; (Y,Gd,Tb,La,Sm,Pr,Lu)$_3$(Al,Ga)$_{5-\alpha}$O$_{12-3/2\alpha}$:Ce$^{3+}$ (wherein $0 \leq \alpha \leq 0.5$); (Ca,Sr)$_8$(Mg,Zn)(SiO$_4$)$_4$Cl$_2$:Eu$^{2+}$, Mn$^{2+}$; Na$_2$Gd$_2$B$_2$O$_7$:Ce$^{3+}$,Tb$^{3+}$; (Sr,Ca,Ba,Mg,Zn)$_2$P$_2$O$_7$:Eu$^{2+}$, Mn$^{2+}$; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$,Ce$^{3+}$; SrY$_2$S$_4$:Eu$^{2+}$; CaLa$_2$S$_4$:Ce$^{3+}$; (Ba,Sr,Ca)MgP$_2$O$_7$:Eu$^{2+}$,Mn$^{2+}$; (Y,Lu)$_2$WO$_6$:Eu$^{3+}$,Mo$^{6+}$; (Ba,Sr,Ca)$_\beta$Si$_\gamma$N$_\mu$:Eu$^{2+}$ (wherein $2\beta+4\gamma=3\mu$); Ca$_3$(SiO$_4$)Cl$_2$:Eu$^{2+}$; (Lu,Sc,Y,Tb)$_{2-u-v}$Ce$_v$Ca$_{1+u}$Li$_w$Mg$_{2-w}$P$_w$(Si,Ge)$_{3-w}$O$_{12-u/2}$ (where $-0.5 \leq u \leq 1$, $0<v \leq 0.1$, and $0 \leq w \leq 0.2$); (Y,Lu,Gd)$_{2-\phi}$Ca$_\phi$Si$_4$N$_{6+\phi}$C$_{1-\phi}$:Ce$^{3+}$, (wherein $0 \leq \phi \leq 0.5$); (Lu,Ca,Li,Mg,Y)alpha-SiAlON doped with Eu$^{2+}$ and/or Ce$^{3+}$; (Ca,Sr,Ba)SiO$_2$N$_2$:Eu$^{2+}$,Ce$^{3+}$; 3.5MgO.0.5MgF$_2$.GeO$_2$:Mn$^{4+}$; Ca$_{1-c-f}$Ce$_c$Eu$_f$Al$_{1+c}$Si$_{1-c}$N$_3$, (where $0<c \leq 0.2$, $0 \leq f \leq 0.2$); Ca$_{1-h-r}$Ce$_h$Eu$_r$Al$_{1-h}$(Mg,Zn)$_h$SiN$_3$, (where $0<h \leq 0.2$, $0 \leq r \leq 0.2$); Ca$_{1-2s-t}$Ce$_s$(Li,Na)$_s$Eu$_t$AlSiN$_3$, (where $0 \leq s \leq 0.2$, $0 \leq f \leq 0.2$, s+t>0); and Ca$_{1-\sigma-\chi-\phi}$Ce$_\sigma$(Li,Na)$_\chi$Eu$_\phi$Al$_{1+\sigma-\chi}$Si$_{1-\sigma+\chi}$N$_3$, (where $0 \leq \sigma \leq 0.2$, $0<\chi \leq 0.4$, $0 \leq \phi \leq 0.2$).

15. The lighting apparatus of claim 1, where said lighting apparatus produces white light.

16. The lighting apparatus of claim 15, where said white light has a CCT of less than 4500K.

17. The lighting apparatus of claim 15, where said white light has a general CRI (R$_a$) greater than 80.

18. The lighting apparatus of claim 15, where said white light has a general CRI greater than 90.

19. The lighting apparatus of claim 15, where said white light has a LER greater than 330 lm/W$_{opt}$.

20. The lighting apparatus of claim 15, where said white light has a color point lying on or substantially on the Planckian locus.

21. The lighting apparatus of claim 20, where a color point of said white light is within 0.01 from the Planckian locus in the vertical direction on the 1931 CIE chromaticity diagram.

22. A phosphor blend comprising at least one complex fluoride phosphor activated with $Mn^{4+}$ and at least one additional phosphor.

23. A phosphor material comprising at least one of: (1) $A_2[MF_6]:Mn^{4+}$, where A is selected from Li, Na, K, Rb, Cs, $NH_4$, and combinations thereof; and where M is selected from Ge, Si, Sn, Ti, Zr, and combinations thereof, providing that when A is K or Cs, M is not Si, Ge or Ti; and when A is Rb, M is not Si; (2) $E[MF_6]:Mn^{4+}$, where E is selected from Mg, Ca, Sr, Ba, Zn, and combinations thereof; and where M is selected from Ge, Si, Sn, Ti, Zr, and combinations thereof; (3) $A_3[ZrF_7]:Mn^{4+}$ where A is selected from Li, Na, K, Rb, Cs, $NH_4$, and combinations thereof; and/or (4) $Ba0.65Zr_{0.35}F_{2.70}:Mn^{4+}$.

* * * * *